United States Patent [19]

Paladino

[11] 4,078,209

[45] Mar. 7, 1978

[54] SOUND COMMUNICATION SYSTEM WITH SPEAKER PROTECTION FOR FREQUENCIES BELOW A PREDETERMINED MINIMUM

[75] Inventor: C. Alfred Paladino, Costa Mesa, Calif.

[73] Assignee: International Telephone and Telegraph Corporation, New York, N.Y.

[21] Appl. No.: 776,628

[22] Filed: Mar. 11, 1977

[51] Int. Cl.² ............................................. H03B 23/00
[52] U.S. Cl. ...................................... 331/47; 331/111; 331/113 R; 340/384 E
[58] Field of Search ............... 331/47, 111, 62, 113 R; 340/183 E; 330/207 P

[56] References Cited

U.S. PATENT DOCUMENTS 3,466,649  9/1969  Colman .................................. 331/47

OTHER PUBLICATIONS

Electronic Sirens, Jim Kyle, Electronics World, Apr., 1964, pp. 32-33.

Primary Examiner—John Kominski
Attorney, Agent, or Firm—A. Donald Stolzy

[57] ABSTRACT

A sound communication system incorporating a triangle wave generator (TWG), a voltage controlled oscillator (VCO) and an output circuit including one or more loudspeakers. The output circuit is connected from the output of the VCO. The output of the TWG is connected to the input of the VCO to control its frequency of oscillation. The TWG can be actuated by a horn ring switch or a momentary contact switch, either of which, when closed, grounds the TWG input and causes the TWG to oscillate. A transistor switch is connected from the TWG input and a third lead from the VCO to cut off the VCO to protect the speaker(s) from damage due to low frequencies.

2 Claims, 3 Drawing Figures

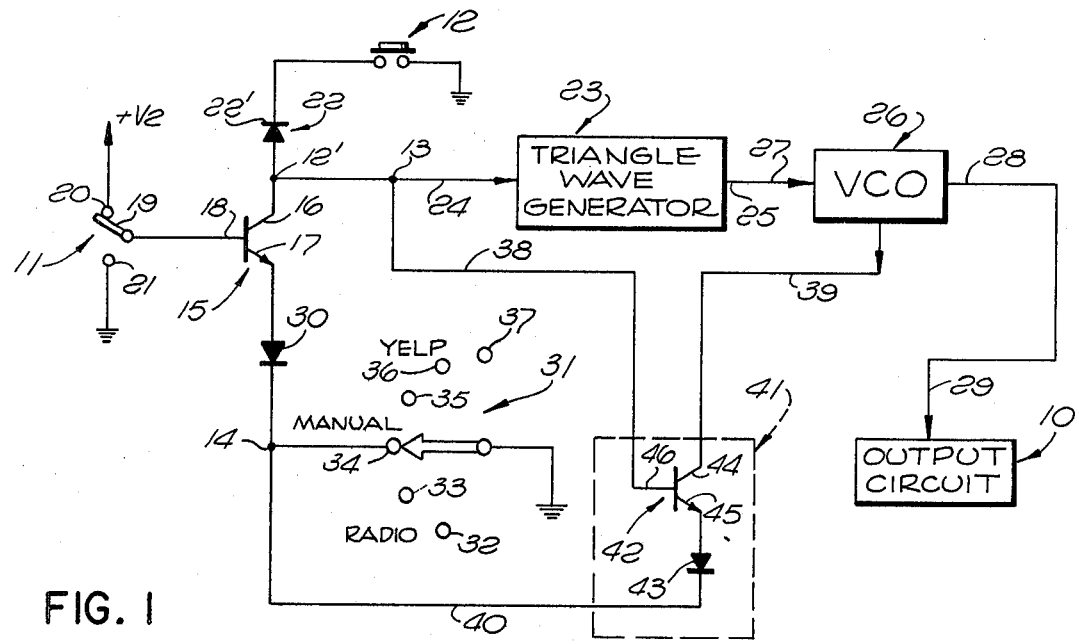
FIG. 1
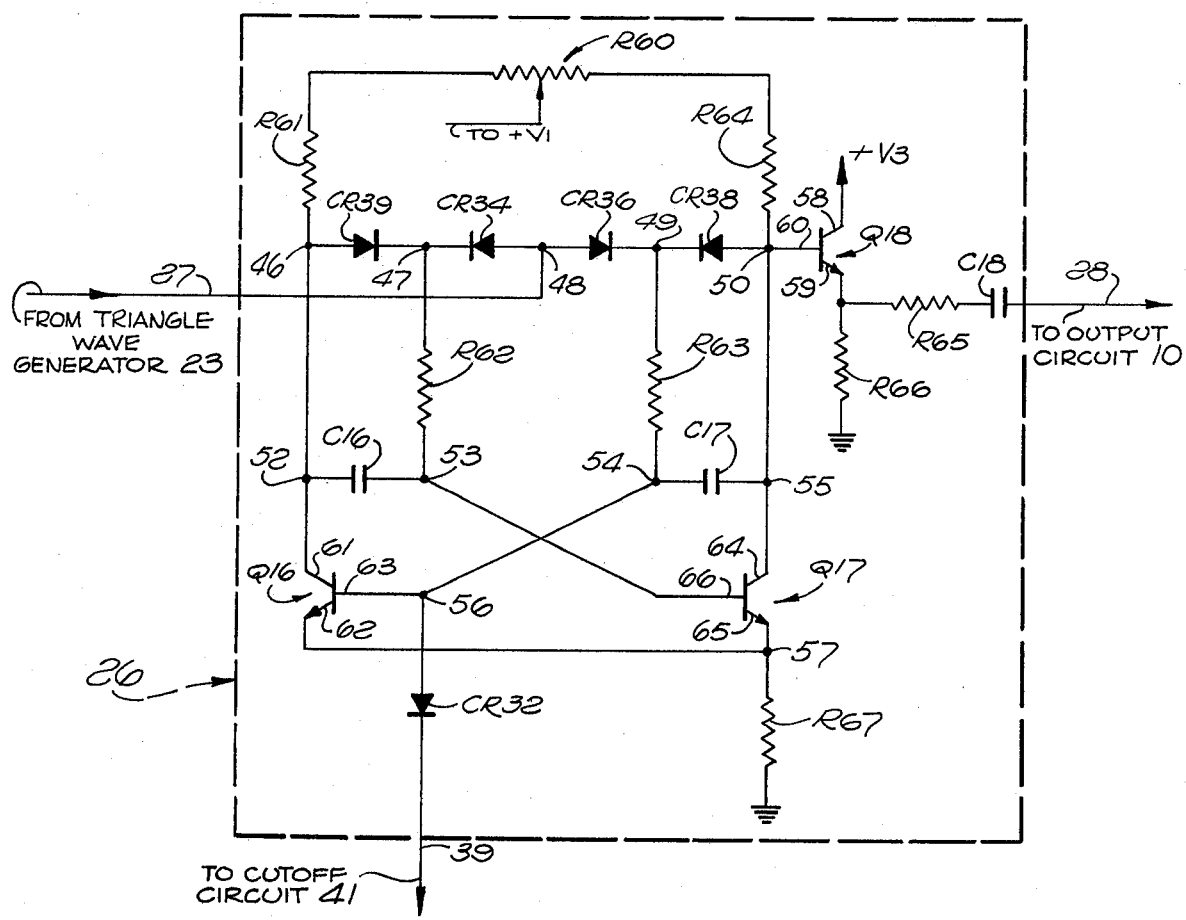
FIG. 2 — VCO

SOUND COMMUNICATION SYSTEM WITH SPEAKER PROTECTION FOR FREQUENCIES BELOW A PREDETERMINED MINIMUM

BACKGROUND OF THE INVENTION

This invention relates to alarms for emergency vehicles or the like, and more particularly to a low frequency cutoff for a voltage controlled oscillator (VCO) in a siren.

It can happen in a siren system that an input oscillator (IO) used to drive a VCO has an input lead which can be grounded for actuation of the IO. Further, the IO input lead rises in potential when disconnected from ground. Still further, together, the IO and VCO can drive a speaker in an output circuit at lower than normal operating frequencies when the IO input rises. When so driven, the speaker can become damaged. This is true because the IO output can, when the IO is shut off, fall below its normal and actuated operating range.

SUMMARY OF THE INVENTION

In accordance with the system of the present invention, the above-described and other disadvantages of the prior art are overcome by providing a siren system comprising: an input oscillator having an input lead and an output lead; switch means having one side connected to said input oscillator input lead and another side connected to a point of a first predetermined potential, said input oscillator being set in oscillation and turned off upon actuation and deactuation of said switch means to change the potential on said input oscillator input lead from a second predetermined potential to a third predetermined potential, respectively, said second predetermined potential appearing on said input oscillator input lead when said switch means is actuated, said third predetermined potential appearing on said input oscillator input lead when said switch means is deactuated, said input oscillator producing a periodic signal on the said output lead thereof when said input oscillator oscillates; a voltage controlled oscillator (VCO) having an input lead, an output lead, and a third lead, said VCO producing a periodic signal on said output lead thereof in accordance with the amplitude of a signal on said input lead thereof, said VCO periodic signal having at least a low frequency in the audio range, and auxiliary means connected from said input oscillator input lead for connecting said VCO third lead to said second predetermined potential, said input oscillator having a construction to cause the frequency of said VCO to fall to a level to cause speaker damage if not corrected, connection of said VCO third lead to said second predetermined potential by said auxiliary means causing said VCO to cease oscillation promptly and to protect against speaker damage.

The above-described and other advantages of the present invention will be better understood from the following detailed description when considered in connection with the accompanying drawings.

BRIEF DESCRIPTION OF THE DRAWINGS

In the drawings which are to be regarded as merely illustrative;

FIG. 1 is a block diagram, partially in schematic, of one embodiment of the present invention;

FIG. 2 is a schematic diagram of a voltage controlled oscillator shown in FIG. 1.

DESCRIPTION OF THE PREFERRED EMBODIMENT

Figure 3:
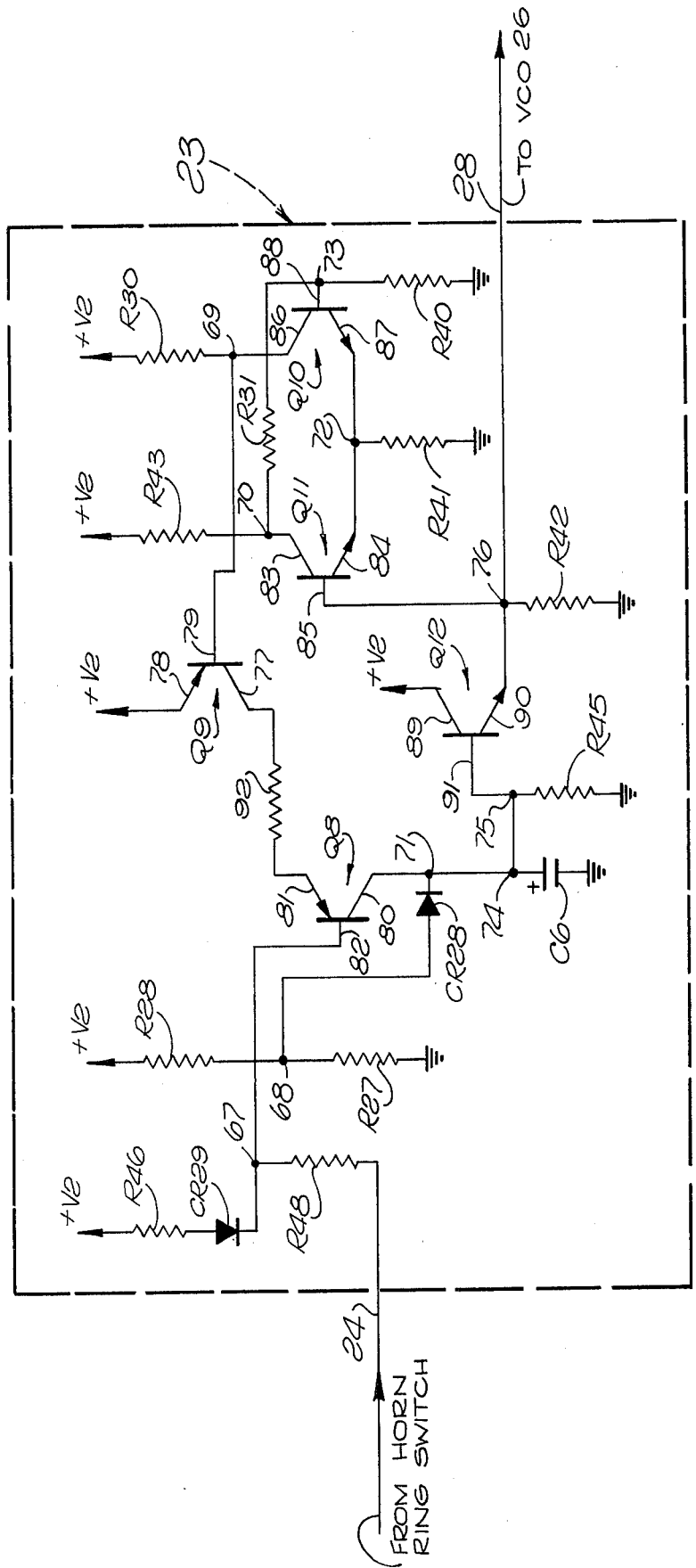
FIG. 3 is a schematic diagram of a triangle wave generator shown in FIG. 1.

The system of FIG. 1 is a siren system having an output circuit 10 including one or more loudspeakers (not shown).

A single-pole double-throw switch is provided at 11, and a momentary contact switch is provided at 12. If desired, switch 11 may be operated by the horn ring on an emergency vehicle, and switch 12 may be manually operated.

The circuit FIG. 1 includes junctions 12', 13 and 14. A transistor is provided at 15 having a collector 16, an emitter 17, and a base 18.

Switch 11 has a pole 19, and contacts 20 and 21 connected, respectively, to a positive potential +V2 and ground.

A diode 22 is connected in series with switch 12 from junction 12' to ground. Collector 16 is connected to junction 12'.

A triangle wave generator is provided at 23 having an input lead 24 and an output lead 25. A voltage controlled oscillator (VCO) 26 is also provided having an input lead 27 and an output lead 28. VCO output lead 28 is connected to an input lead 29 of output circuit 10. Leads 25 and 27 are connected together. Junctions 12' and 13 are connected to triangle wave generator input lead 24. A diode 30 is connected from transistor emitter 17 to junction 14. A single-pole multiple-throw switch is provided at 31 having contacts 32, 33, 34, 35, 36 and 37.

All the structure described from the first mention of output circuit 10 herein to this point may be entirely conventional. The same is true of VCO 26 shown in FIGS. 1 and 2, triangle wave generator 23 shown in FIGS. 1 and 3, leads 38, 39 and 40, and junctions 13 and 14.

In accordance with the present invention, a small circuit is incorporated at 41 including a transistor 42 and a diode 43. Transistor 42 has a collector 44, an emitter 45 and a base 46.

Lead 38 is connected from junction 13 to base 46. Lead 39 is connected from VCO 26 to collector 44. Diode 43 is connected from emitter 45 to lead 40, lead 40 being, in turn, connected to junction 14.

Triangle wave generator 23 oscillates when input lead 24 is connected to ground from junction 12' either through diode 22 and switch 12 or through the collector-emitter circuit of transistor 15 through diode 30, contact 34 and switch 31.

Transistor 15 is at saturation when switch 11 is in the position shown. Triangle wave genrator 23 then oscillates. It does not otherwise oscillate unless the cathode 22' of diode 22 is connected by ground by actuation of switch 12.

Triangle wave generator 23 has two characteristics which must be understood. The first is that input lead 24 rises in potential above ground when switch 12 does not ground cathode 22' of diode 22 or when switch 11 is grounded.

The other characteristic of triangle wave generator 23 to be understood is that when input lead 24 thereof remains ungrounded after the appropriate deactuation of switch 12 or the movement of pole 19 to contact 21, the potential of the output lead 25 of triangle wave generator 23 keeps falling and causes the fundamental or other harmonic output on lead 28 of VCO 26 to fall in frequency to a point where a speaker in output circuit 10 can be or will be damaged. This damage is prevented by circuit 41, which detects the rise in potential on triangle wave generator input lead 24 and places transistor 42 in conduction, connecting VCO 26 through lead 39 and diode 43 to ground through switch contact 34, et cetera.

Multiple-throw switch 31 is conventional and is employed to put the siren through operations which are conventional, but which are not disclosed or described herein.

A schematic diagram of VCO 26 is shown in FIG. 2 including input and output leads 27 and 28, respectively. VCO 26 has junctions 46, 47, 48, 49, 50, 51, 52, 53, 54, 55, 56 and 57.

Input lead 27 is connected to junction 48. Diode CR39 is connected between junctions 46 and 47. A diode CR34 is connected between junctions 47 and 48. A diode CR36 is connected between junctions 48 and 49. A diode CR38 is connected between junctions 49 and 50. Resistor R61, potentiometer R60 and resistor R64 are connected in series in that order from junction 46 to junction 50. A transistor Q18 is provided having a collector 58, an emitter 59 and a base 60. Base 60 is connected from junction 50. Collector 58 is connected to a positive potential +V3. A resistor R65 and a capacitor C18 are connected in that order from junction 51 to output lead 28. A resistor R66 is connected from junction 51 to ground. Junctions 46 and 52 are connected together. Junctions 50 and 55 are connected together. A resistor R62 is connected between junctions 47 and 53. A resistor R63 is connected between junctions 49 and 54. A capacitor C16 is connected between junctions 52 and 53. A capacitor C17 is connected between junctions 54 and 55. Junctions 56 and 54 are connected together. Transistors are provided at Q16 and Q17. Transistor Q16 has a collector 61, an emitter 62 and a base 63. Transistor Q17 has a collector 64, an emitter 65 and a base 66. Collectors 61 and 64 are connected respectively from junctions 52 and 55. Emitters 62 and 65 are connected to junction 57. A resistor R67 is connected from junction 57 to ground. A diode CR32 is connected from junction 56 to lead 39. Transistor bases 63 and 66 are respectively connected from junctions 56 and 53. In FIG. 3, triangle wave generator 23 is shown including junctions 67, 68, 69, 70, 71, 72, 73, 74, 75 and 76.

A transistor Q9 is provided having a collector 77, an emitter 78 and a base 79. A transistor Q8 is provided having a collector 80, an emitter 81 and a base 82. A transistor Q11 is provided having a collector 83, an emitter 84 and a base 85. A transistor Q10 is provided having a collector 86, an emitter 87 and a base 88. A transistor Q12 is provided having a collector 89, an emitter 90 and a base 91.

A resistor R46 and a diode CR29 are connected in series in that order from potential +V2 to junction 67. A resistor R28 is connected from potential +V2 to junction 68. A resistor R27 is connected from junction 68 to ground. A diode CR28 is connected between junctions 68 and 71. A resistor 92 is connected from emitter 81 to collector 77. Collector 80 is connected to junction 71. Junction 71, 74 and 75 are connected together. A capacitor C6 is connected from junction 74 to ground. A resistor R45 is connected from junction 75 to ground. Base 91 is connected from junction 75. Collector 89 is connected to potential +V2. Emitter 90 is connected to junction 76. A resistor R42 is connected from junction 76 to ground. Output lead 28 is connected from junction 76. Base 85 is connected from junction 76. Collector 83 is connected to junction 70. A resistor R31 is connected between junctions 70 and 73. Emitters 84 and 87 are connected to junction 72. Resistor R41 is connected from junction 72 to ground. Resistor R40 is connected from junction 73 to ground. Base 88 is connected from junction 73. Collector 86 is connected to junction 69. A resistor R43 is connected from junction 70 to potential +V2. A resistor R30 is connected from junction 69 to potential V2.

OPERATION

In FIG. 1, triangle wave generator 23 can be caused to oscillate and therefore to frequency modulate the output of VCO 26 either by connecting the cathode 22' of diode 22 to ground by actuation of switch 12 or by moving pole 19 of switch 11 in engagement with contact 20. When one of the switches 11 and 12 are so operated, output circuit 10 produces a siren sound, as is conventional. When both of the switches 11 and 12, after actuation of at least one, are moved to the positions shown in FIG. 1, the potential of input lead 24 rises and causes transistor 42 to conduct. This then connects junction 56 in VCO 26 shown in FIG. 2 to ground through diode CR32 therein, and through the collector-emitter path of transistor 42, through diode 43, and through switch 31. This therefore turns off VCO 26 before the potential of output lead 25 in FIG. 1 falls below its normal operating range. Any speaker in output circuit 10 is then protected from damage due to low output frequencies of VCO 26.

As is conventional, when the potential of transistor base 18 is high, transistor 15 conducts and therefore connects input lead 24 to ground through diode 30 and switch 31.

Note will be taken that switch 11 and transistor 15 may be omitted and switch 12 used by itself. The converse is also true.

What is claimed is:

1. A siren system comprising: an input oscillator having an input lead and an output lead; switch means having one side connected to said input oscillator input lead and another side connected to a point of a first predetermined potential, said input oscillator being set in oscillation and turned off upon actuation and deactuation of said switch means to change the potential on said input oscillator input lead from a second predetermined potential to a third predetermined potential, respectively, said second predetermined potential appearing on said input oscillator input lead when said switch means is actuated, said third predetermined potential appearing on said input oscillator input lead when said switch means is deactuated, said input oscillator producing a periodic signal on the said output lead thereof when said input oscillator oscillates; a voltage controlled oscillator (VCO) having an input lead, an output lead, and a third lead, said VCO producing a periodic signal on said output lead thereof in accordance with the amplitude of a signal on said input lead thereof, said VCO periodic signal having at least a low frequency in the audio range; an output circuit for producing sonic output of said low frequency, said output circuit having an input lead connected from said VCO output lead; and auxiliary means connected from said input oscillator input lead for connecting said VCO third lead to said second predetermined potential, said input oscillator having a construction to cause the frequency of said VCO to fall to a level to cause speaker damage if not corrected, connection of said VCO third lead to said second predetermined potential by said auxiliary means causing said VCO to cease oscillation promptly and to protect against speaker damage.

2. A siren system comprising: an input oscillator having an input lead and an output lead; first and second NPN transistors each having a collector, an emitter, and a base; a single-pole, double-throw (SPDT) switch having a pole connected from said first transistor base, said SPDT switch having first and second contacts for connection to a positive potential and ground, respectively; a single-pole, multiple-throw (SPMT) switch having a MANUAL contact; a first diode connected from said first transistor emitter to said MANUAL contact and poled to be conductive toward said MANUAL contact, said SPMT switch having a grounded pole, said input oscillator input lead being connected from said first transistor collector; a second diode and a momentary contact switch connected in series from ground to said input oscillator input lead, said second diode being poled to be conductive toward ground, said input oscillator being set in oscillation and turned off when said input oscillator input lead is grounded and not grounded, respectively, said input oscillator producing a periodic signal on the said output lead thereof when said input oscillator oscillates; a voltage controlled oscillator (VCO) having an input lead, an output lead, and a third lead, said VCO producing a periodic signal on said output lead thereof in accordance with the amplitude of a signal on said input lead thereof, said VCO periodic signal having at least a low frequency in the audio range; an output circuit for producing sonic output of said low frequency, said output circuit having an input lead connected from said VCO output lead, said second transistor base being connected from said input oscillator input lead, said second transistor collector being connected from said VCO third lead; and a third diode connected from said second transistor emitter to said MANUAL contact, said third diode being poled to be conductive toward said MANUAL contact, said input oscillator having a construction to cause the frequency of said VCO to fall to a level to cause speaker damage if not corrected, connection of said VCO third lead to ground when said second transistor is turned on causing said VCO to cease oscillation promptly when said input oscillator input lead is not at ground to protect against speaker damage, said input oscillator having a construction such that said input lead thereof rises above ground when not grounded through said first transistor or said momentary contact switch.

* * * * *